United States Patent
Higaki et al.

(10) Patent No.: US 8,803,758 B2
(45) Date of Patent: Aug. 12, 2014

(54) ANTENNA DEVICE AND WIRELESS COMMUNICATION APPARATUS

(75) Inventors: Makoto Higaki, Kanagawa (JP); Ippei Kashiwagi, Tokyo (JP); Shuichi Obayashi, Kanagawa (JP); Hiroki Shoki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 13/535,736

(22) Filed: Jun. 28, 2012

(65) Prior Publication Data

US 2013/0002511 A1    Jan. 3, 2013

(30) Foreign Application Priority Data

Jul. 1, 2011 (JP) .................................. 2011-147022

(51) Int. Cl.
*H01Q 1/50* (2006.01)
*H01Q 9/42* (2006.01)

(52) U.S. Cl.
CPC ... *H01Q 1/50* (2013.01); *H01Q 9/42* (2013.01)
USPC .......................................... 343/861; 343/850

(58) Field of Classification Search
CPC .................................. H01Q 9/42; H01Q 1/50
USPC ........................... 343/850, 852, 855, 860, 861
See application file for complete search history.

(56) References Cited

U.S. PATENT DOCUMENTS

| 2005/0184922 | A1 | 8/2005 | Ida et al. |
| 2006/0160501 | A1 | 7/2006 | Mendolia et al. |
| 2007/0285326 | A1 | 12/2007 | McKinzie |
| 2012/0105147 | A1* | 5/2012 | Harris et al. ................. 330/57 |
| 2012/0154245 | A1* | 6/2012 | Nagumo et al. ............. 343/861 |
| 2012/0171970 | A1* | 7/2012 | Muhammad ................... 455/84 |
| 2013/0063223 | A1* | 3/2013 | See et al. ....................... 333/32 |

FOREIGN PATENT DOCUMENTS

| JP | 3075097 | 4/1996 |
| JP | 2003332934 A | 11/2003 |

OTHER PUBLICATIONS

Extended European Search Report (EESR) dated Dec. 5, 2012 (in English) issued in counterpart European Application No. 12173798.5.

Japanese Office Action dated Jun. 10, 2014 in counterpart Japanese Application No. 2011-147022.

* cited by examiner

*Primary Examiner* — Hoanganh Le
(74) *Attorney, Agent, or Firm* — Holtz Holtz Goodman & Chick PC

(57) ABSTRACT

An antenna device of an embodiment includes: an antenna having a feeding point and an end portion apart from the feeding point, the end portion being an open end; a variable impedance matching circuit connected to the antenna at the feeding point; a probe placed in such a position that the distance from the end portion to a tip of the probe is equal to or shorter than one eighth of the wavelength corresponding to the maximum radio frequency used in the antenna device; and a controller that is connected to the probe, and controls the variable impedance matching circuit, based on an electrical signal measured with the probe.

20 Claims, 7 Drawing Sheets

ANTENNA DEVICE AND WIRELESS COMMUNICATION APPARATUS

CROSS-REFERENCE TO RELATED APPLICATION

This application is based upon and claims the benefit of priority from Japanese Patent Application No. 2011-147022, filed on Jul. 1, 2011, the entire contents of which are incorporated herein by reference.

FIELD

Embodiments described herein relate generally to antenna devices and wireless communication apparatuses.

BACKGROUND

In wireless communication devices such as mobile telephones, there are cases where power loss occurs due to a mismatch between the input impedance of an antenna and the output impedance of a wireless device. There has been a technique to reduce the power loss. By this technique, a variable impedance matching circuit is provided between the antenna and the wireless device, a mismatch is detected by some means, and the input impedance of the antenna and the output impedance of the wireless device are automatically matched.

However, when a detecting unit that detects a current, a voltage, and the like is provided between the antenna and the wireless device by the above described technique, there arises trade-off relations between factors such as the size, frequency range, insertion loss, orientation, and binding amount of the detecting unit. Therefore, it is difficult to reduce the size and enhance the performance of the antenna device including the variable impedance matching circuit.

DETAILED DESCRIPTION

Figure 1:
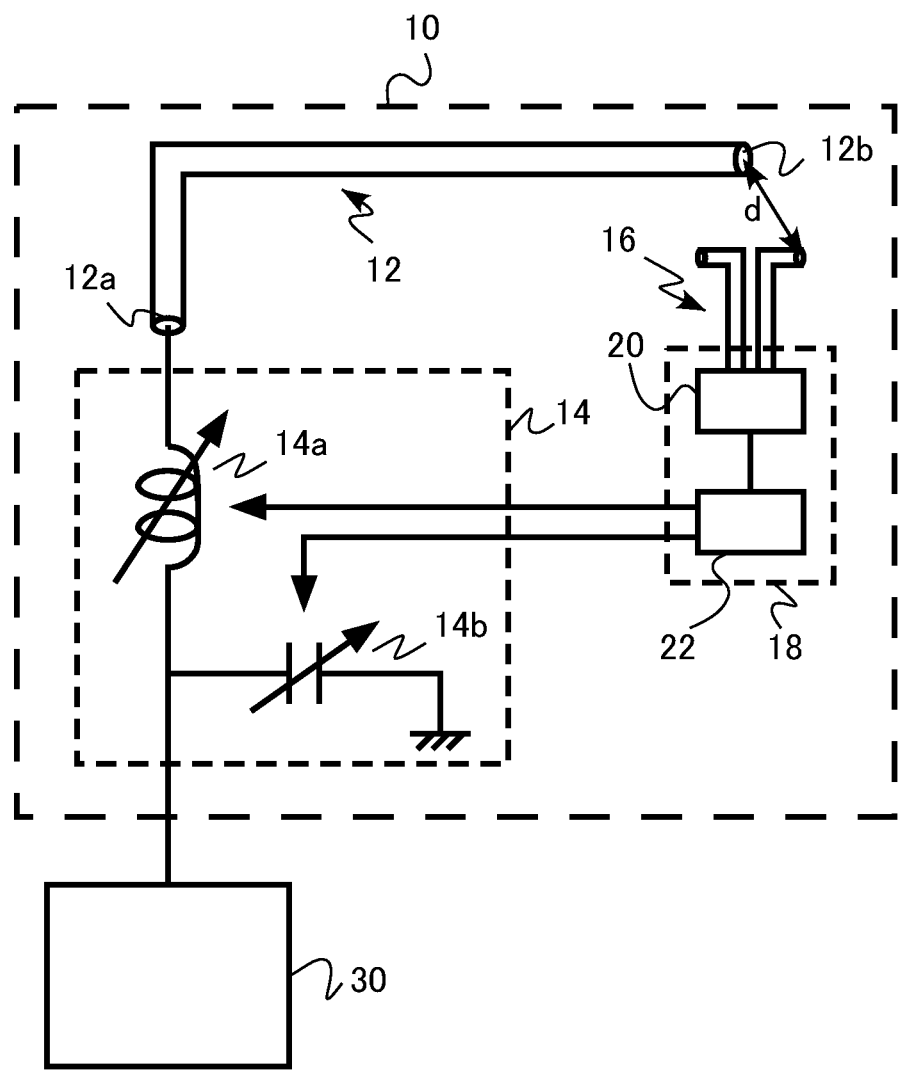
FIG. 1 is a schematic view showing the structure of an antenna device according to a first embodiment.

An antenna device of an embodiment includes: an antenna having a feeding point and an end portion apart from the feeding point, the end portion being an open end; a variable impedance matching circuit connected to the antenna at the feeding point; a probe placed in such a position that the distance from the end portion to a tip of the probe is equal to or shorter than one eighth of the wavelength corresponding to the maximum radio frequency used in the antenna device; and a controller that is connected to the probe, and controls the variable impedance matching circuit, based on an electrical signal measured with the probe.

The following is a description of embodiments, with reference to the drawings. In the drawings, like components are denoted by like reference numerals.

First Embodiment

An antenna device of this embodiment includes: an antenna having a feeding point and an end portion apart from the feeding point, the end portion being an open end; and a variable impedance matching circuit connected to the antenna at the feeding point. The antenna device also includes a probe placed in such a position that the distance from the end portion to a tip of the probe is equal to or shorter than one eighth of the wavelength corresponding to the maximum radio frequency used in the antenna device. The antenna device further includes a controller that is connected to the probe and controls the variable impedance matching circuit based on an electrical signal measured with the probe.

The antenna device of this embodiment has the above described structure, particularly a structure in which a probe as a detecting unit is provided in the vicinity of the open end of the antenna, to detect power from the antenna. Accordingly, a smaller and more sophisticated antenna device including a variable impedance matching circuit can be realized.

FIG. 1 is a schematic view showing the structure of the antenna device of this embodiment.

The antenna device 10 includes: an inverted L antenna 12 having a feeding point 12a and an end portion 12b apart from the feeding point, the end portion 12b being an open end; and a variable impedance matching circuit 14 connected to the inverted L antenna 12 at the feeding point 12a. The antenna device 10 also includes a probe 16 in vicinity so that the distance (shown by "d" in the drawing) from the end portion 12b as the open end to a tip of the probe 16 is equal to or shorter than one eighth of the wavelength corresponding to the maximum wireless frequency used in the antenna device 10. The antenna device 10 further includes a controller 18 that is connected to the probe 16, receives an electrical signal to be measured with the probe 16, and, based on the electrical signal, controls the variable impedance matching circuit 14.

FIG. 1 shows the antenna device 10 and a wireless device 30 connected to the opposite side of the variable impedance matching circuit 14 from the inverted L antenna 12. The wireless device 30 is a transmitter, for example. The antenna device 10 and the wireless device 30 connected to the antenna device 10 constitute a wireless communication apparatus. The wireless communication apparatus is a mobile telephone, for example.

The inverted L antenna 12 is an antenna formed with a conductor, and has an open end that is the end far from the feeding point 12a. To reduce the size and simplify the design of the wireless communication apparatus including the antenna device 10, the use of the inverted L antenna 12 is desirable. However, the shape of the antenna is not limited to that of an inverted L antenna.

The variable impedance matching circuit 14 includes a variable inductor 14a and a variable capacitor 14b. Although the variable impedance matching circuit 14 is formed with the variable inductor 14a and the variable capacitor 14b in this embodiment, there is not a limit on the numbers of variable inductors 14a and variable capacitors 14b to be used, and on the circuit connection topology. Other than the variable inductor 14a and the variable capacitor 14b, a switch may also be used as a variable impedance element. Those variable elements may be embodied by any components such as semiconductors or MEMSs (Micro Electro Mechanical Systems).

The probe 16 is a dipole-type differential probe formed with two symmetrical conductors. To increase the tolerance for noise from the electronic components and the like of the wireless communication apparatus to which the antenna device 10 is connected, the probe 16 is preferably a differential probe. Alternatively, a monopole- or loop-type probe may be used.

The distance between the end portion 12b of the inverted L antenna 12 and a tip of the probe 16 is calculated by measuring the longest distance between the two portions.

The controller 18 includes a power detector 20 and an arithmetic circuit 22. The power detector 20 is connected to the probe 16, and the arithmetic circuit 22 is connected to the variable impedance matching circuit 14.

The power detector 20 has a function to output a DC voltage, direct current, or binary data that corresponds to the intensity of the electrical signal measured with the probe 16. The arithmetic circuit 22 has a function to perform an arithmetic operation and transmit a control signal to the variable impedance matching circuit 14 so that the detected power of which the arithmetic circuit 22 is to be notified by the power detector 20 is maximized.

In the following, functions and effects of the antenna device of this embodiment are described.

The probe 16 detects a change in the charge amount at the end portion 12b, which is the open end of the inverted L antenna 12, and outputs the change as electrical power through capacitive coupling. The power detector 20 in the controller 18 then outputs the DC voltage, direct current, or binary data corresponding to the intensity of the electrical signal measured with the probe 16, to the arithmetic circuit 22 in the controller 18. The arithmetic circuit 22 then performs an arithmetic operation and transmits a control signal to the variable impedance matching circuit 14 so that the detected power of which the arithmetic circuit 22 is to be notified by the power detector 20 is maximized.

In general, supplied power is larger when the matching state between the input impedance of the antenna and the output impedance of the wireless device is better. Therefore, as the power supplied from the feeding point 12a becomes larger, the current in the inverted L antenna 12 becomes larger. Accordingly, the charge amount in the open end at the opposite end from the feeding point 12a becomes larger. As a result, the detected power (the electrical signal) from the probe 16 becomes larger through the capacitive coupling with the probe 16 placed in the vicinity of the end portion 12b serving as the open end. Therefore, where control is performed so that the power to be detected by the probe 16 becomes larger, the matching state of the inverted L antenna 12 improves. That is, impedance matching is realized.

In this embodiment, the controller 18 controls the variable impedance matching circuit 14 based on the power detected by the probe 16, to realize the impedance matching.

The power detector 20 in the controller 18 outputs the DC voltage, direct current, or binary data corresponding to the intensity of the electrical signal measured with the probe 16, to the arithmetic circuit 22 in the controller 18. The arithmetic circuit 22 controls the variable impedance matching circuit 14 so that the detected power of which the arithmetic circuit 22 is to be notified by the power detector 20 is maximized.

Specifically, the controller 18 outputs an instruction based on the arithmetic operation at the arithmetic circuit 22 and its result as a control signal to the variable impedance matching circuit 14, for example. In accordance with the signal, the impedance values of the variable impedance elements (the variable inductor 14a and the variable capacitor 14b in this case) in the variable impedance matching circuit 14 are controlled.

For example, the impedance values of the variable elements may be randomly varied, and the control signal obtained when the power detected by the power detector 20 becomes largest may be stored. Alternatively, all possible combinations of states of the variable elements may be set, and the control signal obtained when the detected power becomes largest may be stored. The control method used by the controller 18 may be any control method such as the above described simple method or a known method, as long as the power detected by the power detector 20 can be maximized.

As described above, according to this embodiment, by placing the probe 16 as the detecting unit in the vicinity of the antenna tip as an open end, the impedance matching state of the antenna can be evaluated by the amount of the power detected by the probe 16. Accordingly, high-precision impedance matching in a wide radio frequency range can be realized with a simple and small-sized structure, regardless of the frequencies used by the antenna device. In addition, only loss in impedance matching in the antenna device of this embodiment is the power detected by the probe 16. Accordingly, an antenna device with extremely low loss can be realized. Further, impedance matching can be automatically performed, as the controller 18 controls the variable impedance matching circuit 14.

The following is the reason that the distance from the end portion 12b as the open end to a tip of the probe 16 is defined as equal to or shorter than one eighth of the wavelength corresponding to the maximum radio frequency used in the antenna device in this embodiment. The end portion 12b serving as the open end of the antenna becomes an anti-node of charge and a node of current. Therefore, if the power detected by the probe 16 becomes largest at this location, the current flowing in the antenna increases, and the antenna resonates. Accordingly, an impedance matching state is achieved. Meanwhile, the position where the distance from the end portion 12b as the open end of the antenna in the direction toward the feeding point 12a of the antenna is one fourth of the wavelength corresponding to the maximum radio frequency used therein is the position which becomes a node of charge and an anti-node of current. Therefore, if control is performed so that the power detected by the probe 16 becomes largest in this position, the current flowing in the antenna is restrained, resulting in an antenna mismatching state. Such a position is not suitable as a position to detect the power supplied to the antenna.

The position where the distance from the end portion 12b as the open end of the antenna is one eighth of the wavelength corresponding to the maximum radio frequency used therein is the halfway point between the end portion 12b and the one-fourth wavelength position. At a position closer to the end portion 12b than to this position, the resonant and matching states of the antenna can be improved by maximizing the power to be detected by the probe 16. In other words, if the power to be detected is maximized at a position closer to the one-fourth wavelength position than to the one-eighth wavelength position, the matching state of the antenna is degraded.

In view of the above, any position between the end portion 12b and the one-eighth wavelength position can be regarded as preferable as a position to detect the power supplied to the antenna. If a tip of the probe 16 is located in a position where the distance from the end portion 12b of the antenna is equal to or shorter than one eighth of the wavelength corresponding to the maximum radio frequency used therein, the tip of the probe 16 is located in a position where the distance is equal to or shorter than one eighth of the wavelength corresponding to any radio frequency used therein. Therefore, the power supplied to the antenna is evaluated, and the detected power is controlled and maximized. In this manner, antenna impedance matching can be performed.

The power detecting capability of the probe 16 through capacitive coupling is lower at a position further away from the antenna. At a position where the spatial distance from the end portion 12b as the open end of the antenna is one eighth of the wavelength corresponding to the radio frequency used therein, the decrease in power detection capability can fall within an allowable range to achieve sufficient impedance matching precision. Therefore, if a tip of the probe 16 is placed in a position where the distance is equal to or shorter than one eighth of the wavelength corresponding to the maximum radio frequency used therein, the amount of power supplied to the antenna can be suitably detected at any radio frequency used therein, and antenna impedance matching can be realized.

In this embodiment, the resonant frequency of the probe 16 is preferably higher than the maximum radio frequency used in the antenna device 10. If the resonant frequency of the probe 16 is equal to or lower than the maximum radio frequency used in the antenna device 10, then the current distribution becomes to include a node in the probe 16. As a result, the capacitive coupling with the antenna becomes complicated, and the simple relationship under which impedance matching is realized by maximizing the power detected by the probe 16 is lost. When the power supplied from the feeding point 12a becomes larger because the resonant frequency of the probe 16 is higher than the maximum radio frequency used in the antenna device, the power (an electrical signal) detected by the probe 16 also becomes larger. This relationship is realized, regardless of the radio frequency used therein.

Second Embodiment

In an antenna device of this embodiment, an antenna has a shape splitting into branches when seen from the feeding point. The end portions of all the branches are open ends, and a probe is placed in such a position that the distance from each of the end portions to a tip of the probe is equal to or shorter than one eighth of the wavelength corresponding to the maximum radio frequency used in the antenna device. This embodiment is the same as the first embodiment, except that the antenna splits into branches. Therefore, explanation of the same aspects as those of the first embodiment will not be repeated herein.

Figure 2:
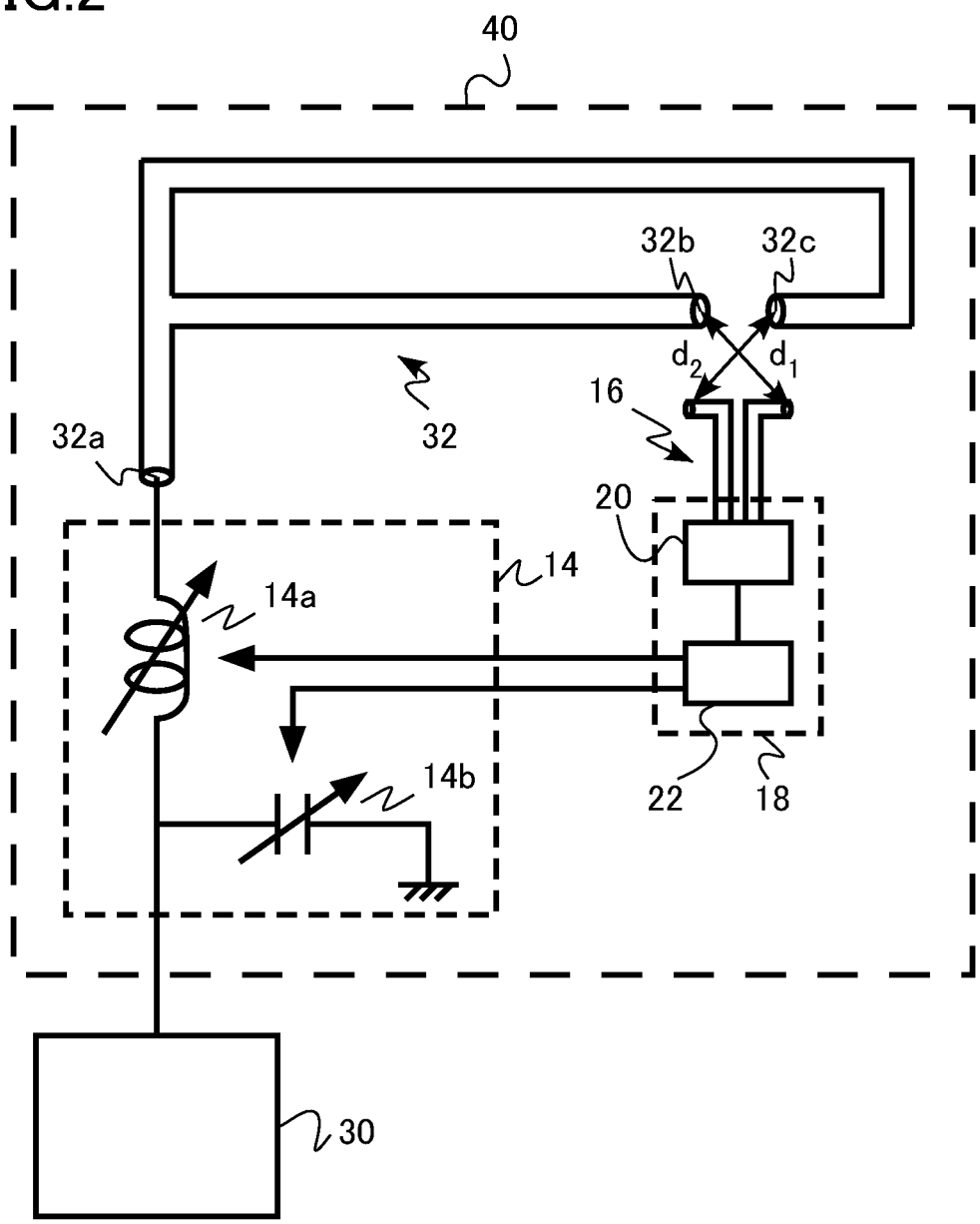
FIG. 2 is a schematic view showing the structure of an antenna device according to a second embodiment.

FIG. 2 is a schematic view showing the structure of the antenna device of this embodiment.

An antenna device 40 includes a monopole antenna 32 that has a shape splitting into two branches when seen from a feeding point 32a. The end portions 32b and 32c of both branches are open ends. Each of the distances (shown by "$d_1$" and "$d_2$" in the drawing) from the end portions 32b and 32c as the open ends to the tips of the probes 16 is designed to be equal to or shorter than one eighth of the wavelength corresponding to the maximum radio frequency used in the antenna device. In this embodiment, the above described distance is realized by folding one of the two branches of the monopole antenna 32.

As the monopole antenna 32 has a conductor splitting into two branches, the antenna device of this embodiment can cope with two different radio frequency ranges. Accordingly, high-precision impedance matching can be realized with a single mechanism, regardless of which of the two conductors of the monopole antenna 32 has a dominant current distribution.

Third Embodiment

In an antenna device of this embodiment, the controller includes: a power detector connected to the probe; an AD converter that converts an analog output of the power detector into binary data; a buffer that stores binary data at a certain sampling time; a comparator that compares the value of the binary data from the AD converter with the value of the binary data stored in the buffer; and an up/down counter storing the number of counts that increases and decreases with the comparison logic performed by the comparator, and has its binary output connected to variable impedance elements in a variable impedance matching circuit. This embodiment is the same as the first embodiment, except that the arithmetic circuit of the controller will be specifically described, and the variable impedance matching circuit has a different structure. Therefore, explanation of the same aspects as those of the first embodiment will not be repeated herein.

Figure 3:
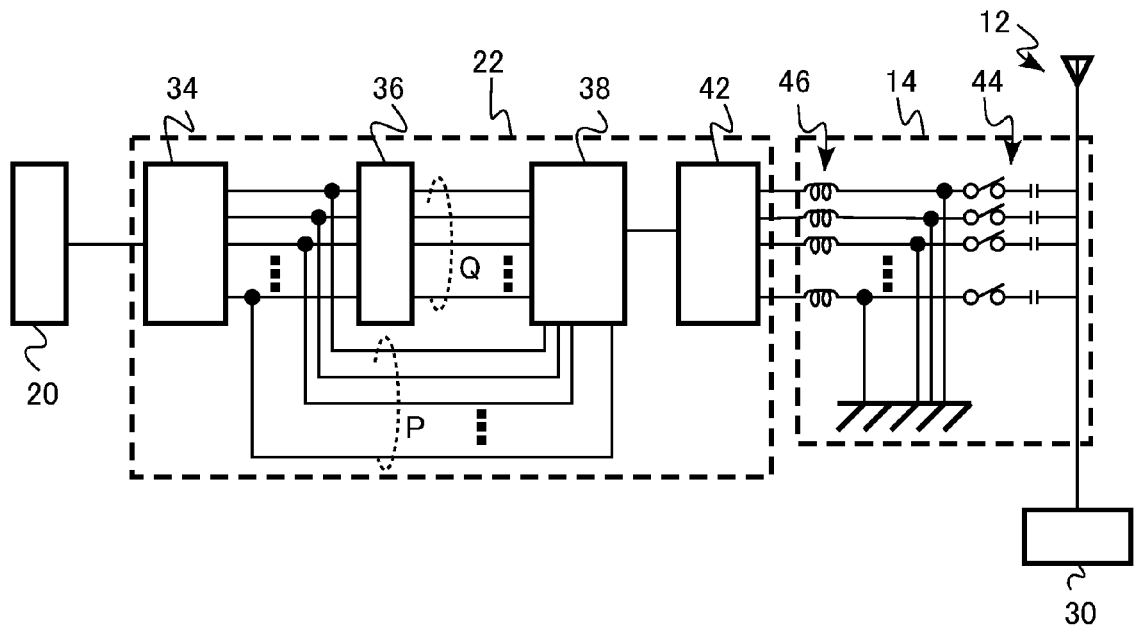
FIG. 3 is a diagram specifically showing the structures of the arithmetic circuit and the impedance matching circuit of an antenna device according to a third embodiment.

FIG. 3 is a diagram specifically showing the structures of the arithmetic circuit and the impedance matching circuit of the antenna device according to this embodiment.

The arithmetic circuit 22 includes an AD converter 34 connected to a power detector 20, a buffer 36 connected to the AD converter 34, a comparator 38 connected to the AD converter 34 and the buffer 36, and an up/down counter 42 connected to the comparator 38.

A variable impedance matching circuit 14 includes a variable capacitor 44 that includes switches and capacitors that are connected to the up/down counter 42. An inductor 46 is provided between the variable capacitor 44 and the up/down counter 42.

In the variable capacitor 44, the respective capacitors are connected in parallel to a line provided between a wireless device 30 and an antenna 12.

The AD converter 34 outputs binary data corresponding to the DC voltage or direct current equivalent to the detected power obtained from the power detector 20. The buffer 36 stores the binary data at a time designated by a clock signal or the like.

The comparator 38 compares binary data (P) from the power detector 20 with the binary data (Q) from the buffer 36, and logically outputs the comparison result. In accordance with the logic output from the comparator 38, the number of counts in the up/down counter 42 increases or decreases. That is, the up/down counter 42 increments (up counts) or decrements (down counts) binary data.

The binary data P and Q connected to the comparator 38 is the data P obtained at the time of the comparing operation, and the data Q obtained one sampling time earlier. Where P is larger than Q, the detected power has increased. Where P is smaller than Q, the detected power has decreased.

If the capacitance value with which the detected power becomes largest exists within the capacitance value variable range of the variable capacitor 44, the number of counts in the up/down counter 42 is incremented by a logic output indicating P>Q, and is decremented by a logic output indicating P<Q. In this manner, a control signal based on the number of counts is transmitted to an impedance matching circuit 14, so that the variable capacitor 44 can be controlled to maximize the detected power.

The antenna device of this embodiment can also achieve the same functions and effects as those of the first embodiment.

Fourth Embodiment

In an antenna device of this embodiment, a variable impedance element in the variable impedance matching circuit is a variable-capacitance diode. In addition, the controller includes a DA converter. Other than those two aspects, this embodiment is the same as the third embodiment. Therefore, explanation of the same aspects as those of the third embodiment will not be repeated herein.

Figure 4:
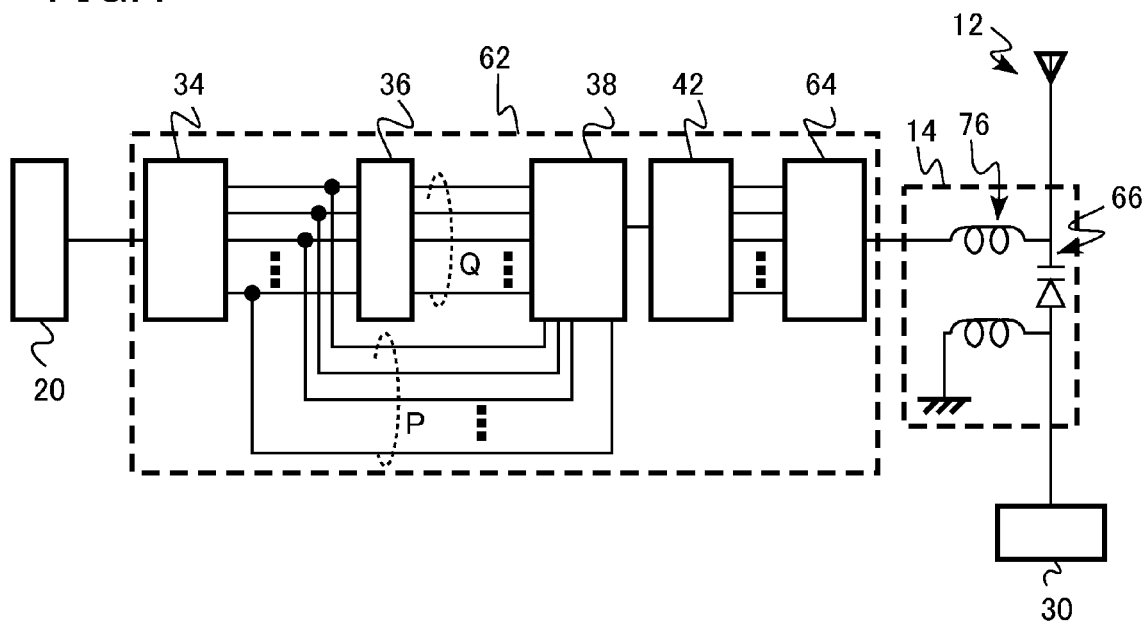
FIG. 4 is a diagram specifically showing the structures of the arithmetic circuit and the impedance matching circuit of an antenna device according to a fourth embodiment.

FIG. 4 is a diagram specifically showing the structures of the arithmetic circuit and the impedance matching circuit of the antenna device according to this embodiment.

In the antenna device of this embodiment, an arithmetic circuit 62 includes an AD converter 34 connected to a power detector 20, a buffer 36 connected to the AD converter 34, a comparator 38 connected to the AD converter 34 and the buffer 36, an up/down counter 42 connected to the comparator 38, and a DA converter 64 connected to the binary output of the up/down counter 42. A variable impedance matching circuit 14 includes a variable-capacitance diode 66 and an inductor 76 that are connected to the DA converter 64. The variable-capacitance diode 66 is a MEMS, for example.

The DA converter 64 outputs a bias voltage, which is a DC voltage or direct current proportional to the binary output of the up/down counter 42, to the variable impedance matching circuit 14. Since the binary output of the number of counts from the up/down counter 42 and the voltage output from the DA converter 64 are proportional to each other, the variable impedance matching circuit 14 can be controlled to maximize the detected power, as in the third embodiment.

The antenna device of this embodiment can also achieve the same functions and effects as those of the third embodiment.

Fifth Embodiment

In an antenna device of this embodiment, the controller includes: a power detector connected to a probe; an AD converter that converts an analog output of the power detector into binary data; a first buffer that stores the binary data at a first time; a second buffer that stores binary data at a second time that is one sampling time before the first time; a comparator that compares the value of the binary data stored in the first buffer with the value of the binary data stored in the second buffer; an up/down counter storing the number of counts that increases or decreases with the comparison logic performed by the comparator; and a DA converter that outputs a bias voltage to a variable impedance matching circuit in accordance with the binary value of the number of counts in the up/down counter. Other than the structure of the controller, this embodiment is the same as the fourth embodiment. Therefore, explanation of the same aspects as those of the fourth embodiment will not be repeated herein.

Figure 5:
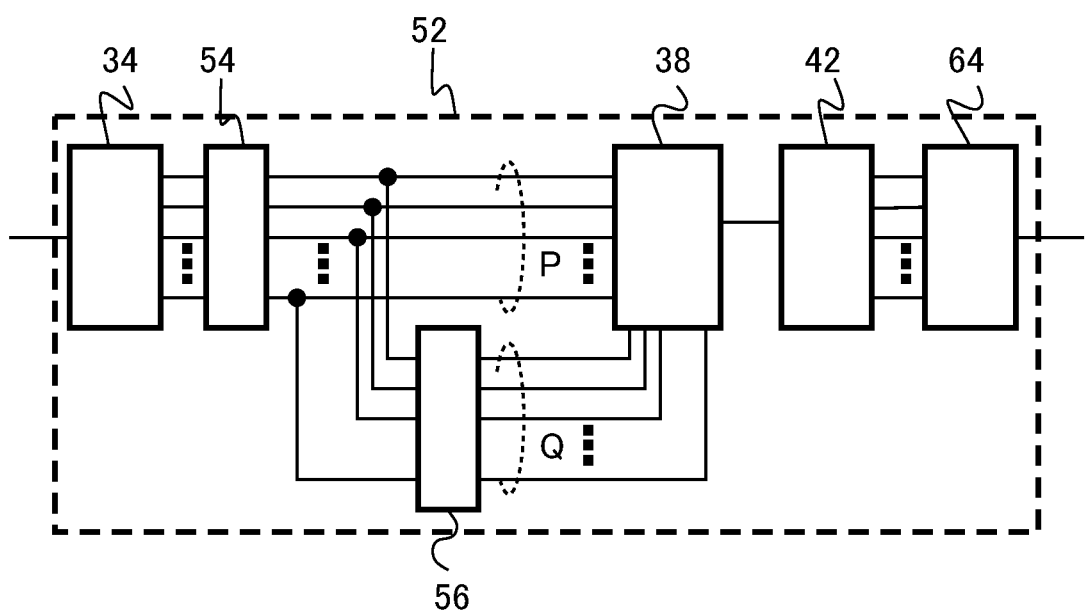
FIG. 5 is a diagram specifically showing the structure of the arithmetic circuit of an antenna device according to a fifth embodiment.

FIG. 5 is a diagram specifically showing the structure of the arithmetic circuit of the antenna device of this embodiment.

An arithmetic circuit 52 includes an AD converter 34 connected to a power detector (not shown), a first buffer 54 connected to the AD converter 34, a second buffer 56 connected to the first buffer 54, a comparator 38 connected to the first buffer 54 and the second buffer 56, an up/down counter 42 connected to the comparator 38, and a DA converter 64. The output of the DA converter 64 is connected to a variable impedance matching circuit (not shown).

The AD converter 34 outputs binary data corresponding to the DC voltage or direct current equivalent to the value of the detected power obtained from the power detector. The first buffer 54 stores binary data (P) at a first time designated by a clock signal or the like. The second buffer 56 stores binary data (Q) at a second time that is one sampling time before the first time.

The comparator 38 compares the value of the binary data (P) from the first buffer 54 with the value of the binary data (Q) from the second buffer 56, and logically outputs the comparison result. In accordance with the logic output from the comparator 38, the number of counts in the up/down counter 42 is increased or decreased. That is, the up/down counter 42 increments or decrements the binary data of the number of counts. In accordance with the binary value of the number of counts in the up/down counter 42, the DA converter 64 outputs a bias voltage to the variable impedance matching circuit.

According to this embodiment, the binary data to be subjected to the comparison by the comparator 38 is the data stored in the buffers. Accordingly, the binary data can be certainly obtained in synchronization, and more stable operations can be performed than in the third embodiment. Thus, more precise impedance matching can be realized.

Sixth Embodiment

An antenna device of this embodiment further includes a power amplifier connected to the opposite side of the variable impedance matching circuit from the antenna. A gain signal of the power amplifier is input to the controller, and, based on the gain signal, the controller controls the variable impedance matching circuit. Other than that, this embodiment is the same as the first embodiment. Therefore, explanation of the same aspects as those of the first embodiment will not be repeated herein.

Figure 6:
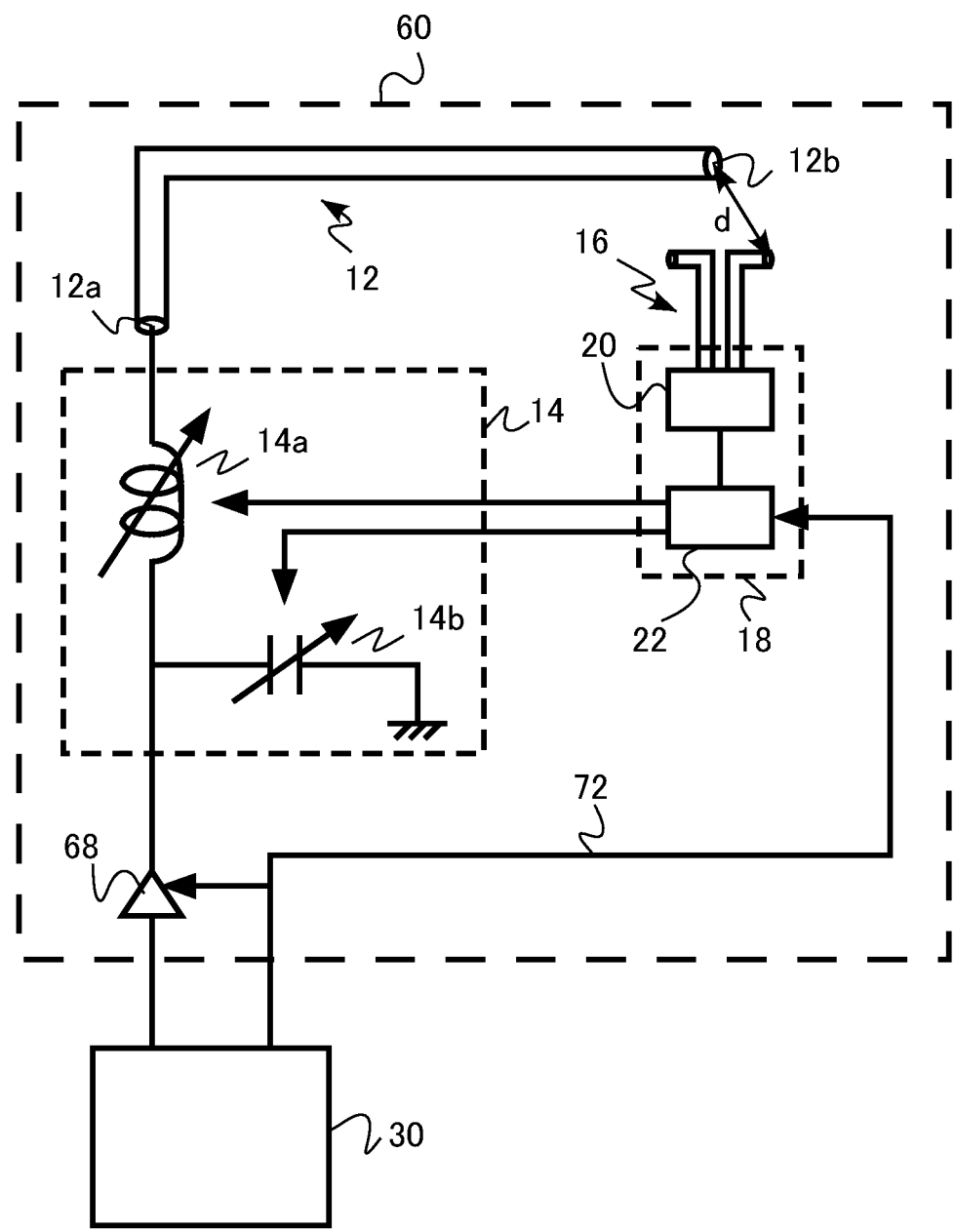
FIG. 6 is a schematic view showing the structure of an antenna device according to a sixth embodiment.

FIG. 6 is a schematic view showing the structure of the antenna device of this embodiment.

An antenna device 60 of this embodiment includes: an inverted L antenna 12; a variable impedance matching unit 14 connected to a feeding point 12a of the inverted L antenna 12; a variable gain power amplifier 68 connected to the variable impedance matching unit 14; and a probe 16 that is placed in vicinity so that the distance from an end portion 12b of the inverted L antenna 12 is equal to or shorter than one eighth of the wavelength corresponding to the maximum radio frequency used therein. The antenna device 60 also includes a controller 18 that is connected to the probe 16, receives an electrical signal measured with the probe 16, and, based on the electrical signal, controls the variable impedance matching unit 14.

The controller 18 includes a power detector 20 and an arithmetic circuit 22. The power detector 20 is connected to the probe 16, and the arithmetic circuit 22 is connected to the variable impedance matching unit 14.

The arithmetic circuit 22 is connected to the variable gain power amplifier 68 and the power detector 20. The arithmetic circuit 22 and the variable gain power amplifier 68 are connected to each other by a gain control line 72. The variable impedance matching circuit 14 includes a variable inductor 14a and a variable capacitor 14b.

The variable gain power amplifier 68 amplifies radio frequency signal power by a gain defined by a gain control signal transmitted through the gain control line 72. Further, a gain signal from the variable gain power amplifier 68 is input to the controller 18. Based on the gain signal, the controller 18 controls the variable impedance matching circuit 14.

Here, the gain of the variable gain power amplifier 68 is represented by A. As the gain A varies, the power detected by the power detector 20 varies in proportion to the gain A. If the arithmetic circuit 22 performs an arithmetic operation to multiply the output of the power detector 20 by 1/A, the data to be controlled should be the same as that in a case where the variable gain power amplifier 68 is not provided. Accordingly, even if the gain A of the variable gain power amplifier 68 varies with time, antenna impedance matching can be automatically performed as in the first embodiment.

Seventh Embodiment

An antenna device of this embodiment is the same as that of the sixth embodiment, except that the variable gain power amplifier is connected not to the arithmetic circuit but to the power detector. Therefore, explanation of the same aspects as those of the sixth embodiment will not be repeated herein.

Figure 7:
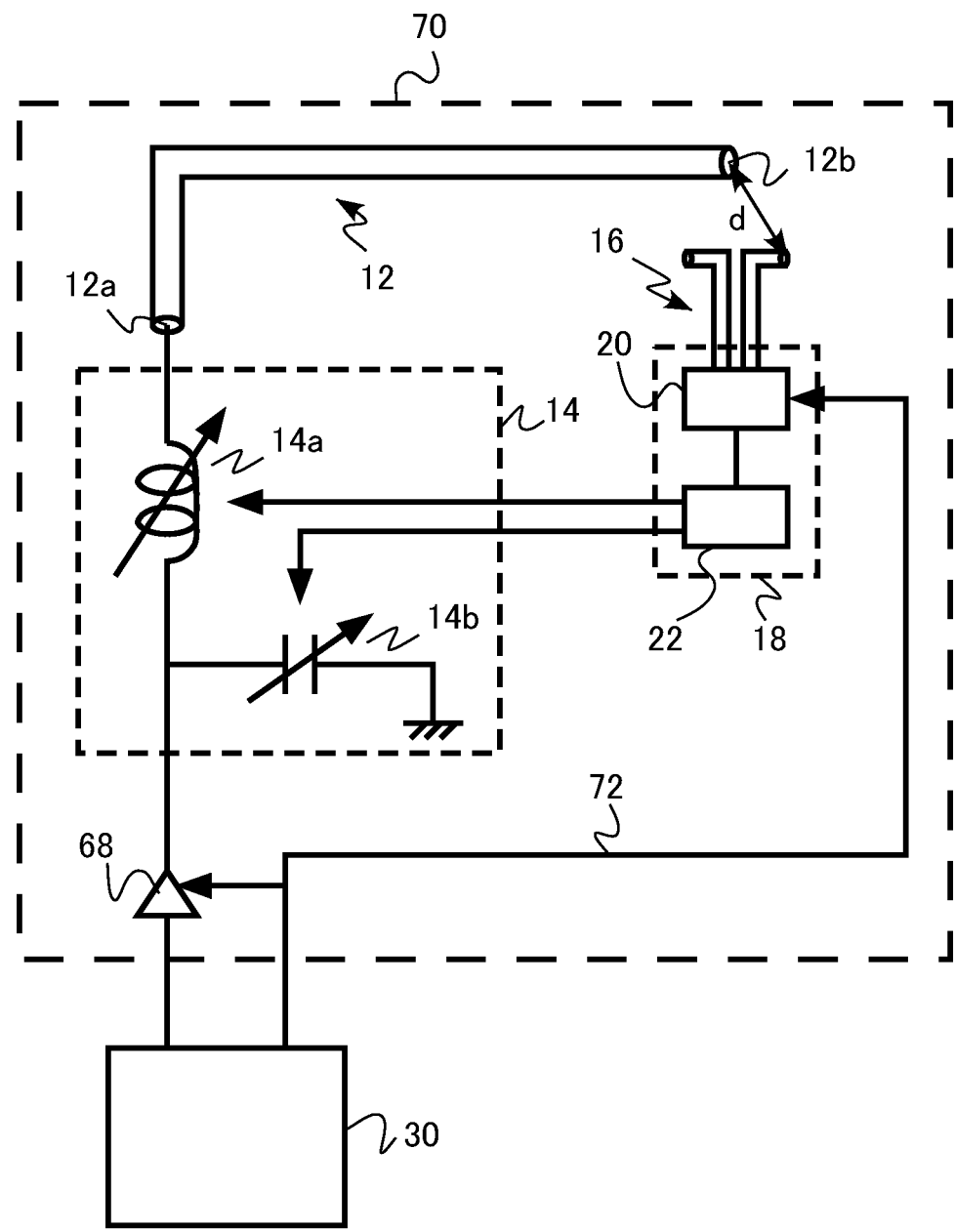
FIG. 7 is a schematic view showing the structure of an antenna device according to a seventh embodiment.

FIG. 7 is a schematic view showing the structure of the antenna device of this embodiment.

An antenna device 70 of this embodiment includes: an inverted L antenna 12; a variable impedance matching circuit 14 connected to a feeding point 12a of the inverted L antenna 12; a variable gain power amplifier 68 connected to the variable impedance matching circuit 14; and a probe 16 that is placed in vicinity so that the distance from the tip of the inverted L antenna 12 is equal to or shorter than one eighth of the wavelength corresponding to the maximum radio frequency used therein. The antenna device 70 also includes a controller 18 that is connected to the probe 16, receives an electrical signal measured with the probe 16, and, based on the electrical signal, controls the variable impedance matching circuit 14.

The controller 18 includes a power detector 20 and an arithmetic circuit 22. The power detector 20 is connected to the probe 16, and the arithmetic circuit 22 is connected to the variable impedance matching circuit 14.

The power detector 20 is connected to the variable gain power amplifier 68. The power detector 20 and the variable gain power amplifier 68 are connected to each other by a gain control line 72. The variable impedance matching circuit 14 includes a variable inductor 14a and a variable capacitor 14b.

The variable gain power amplifier 68 amplifies radio frequency signal power by a gain defined by a gain control signal transmitted through the gain control line 72.

The power detector 20 calculates detected power by repeating a comparison with power detected by varying reference power. Therefore, the reference power is made proportional to the gain control signal containing the information about the gain A of the variable gain power amplifier 68, so that the power detector 20 can detect power at high resolution with reference power multiplied by the gain A. Accordingly, with the antenna device of this embodiment, antenna impedance matching can be automatically performed with the same precision as that in a case where the variable gain power amplifier 68 is not provided.

Eighth Embodiment

An antenna device of this embodiment includes two antennas with tips adjacent to each other. One of the antennas is used as the probe of the first embodiment in performing impedance matching. Explanation of the same aspects as those of the first embodiment will not be repeated herein.

Figure 8:
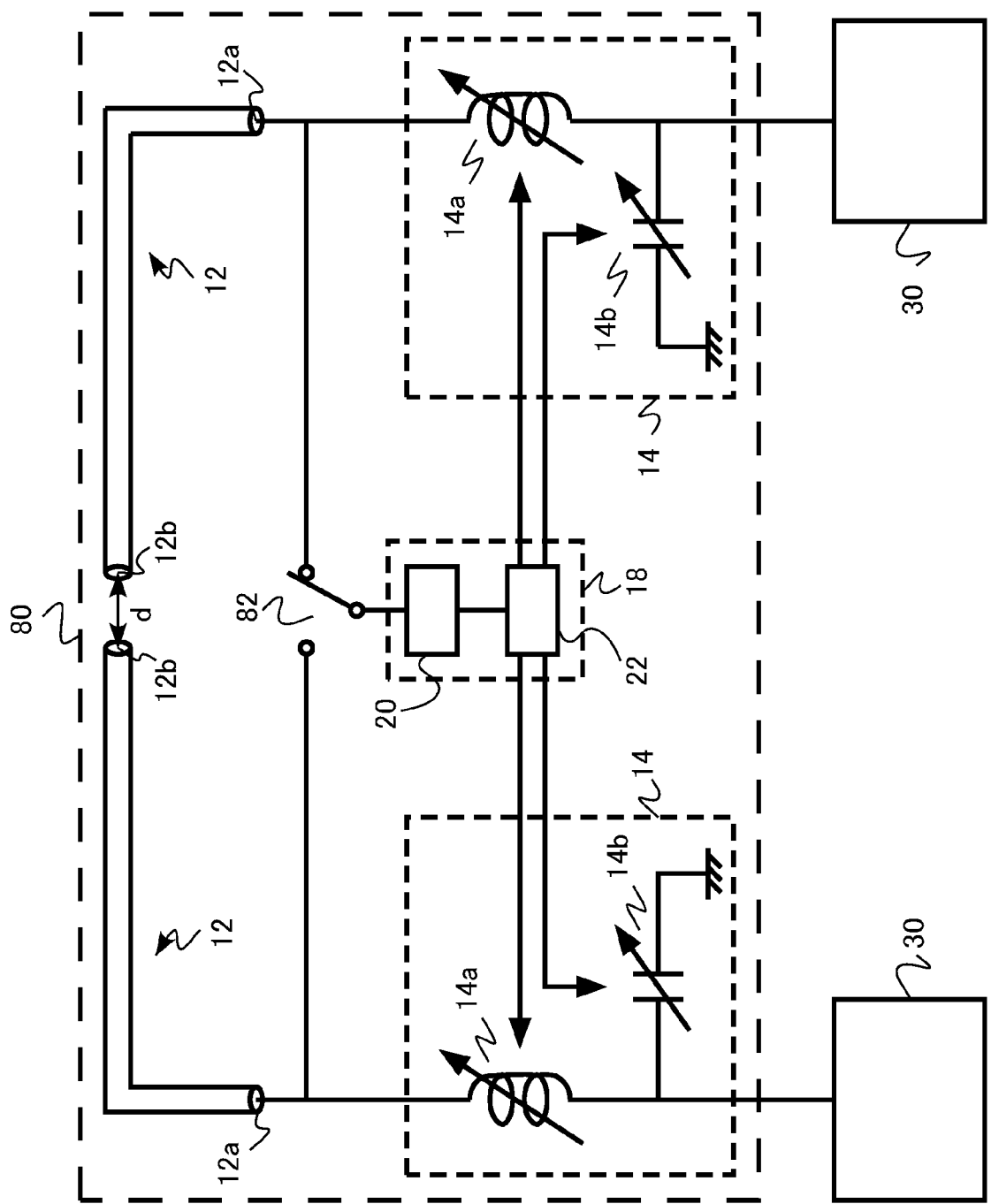
FIG. 8 is a schematic view showing the structure of an antenna device according to an eighth embodiment.

FIG. 8 is a schematic view showing the structure of the antenna device of this embodiment.

An antenna device 80 of this embodiment includes: two inverted L antennas 12 arranged so that the distance (shown by "d" in the drawing) between two end portions 12b as open ends is equal to or shorter than one eighth of the wavelength corresponding to the radio frequency used therein; two variable impedance matching circuits 14 respectively connected to feeding points 12a of the two inverted L antennas 12; and a connection switch 82 that switches connections between the inverted L antennas 12 and the variable impedance matching circuits 14. The antenna device 80 also includes a controller 18 connected to the connection switch 82.

The variable impedance matching circuit 14 includes a variable inductor 14a and a variable capacitor 14b. The controller 18 includes a power detector 20 and an arithmetic circuit 22. The power detector 20 is connected to the connection switch 82, and the arithmetic circuit 22 is connected to the two variable impedance matching circuits 14.

While one of the two inverted L antennas 12 is performing transmission, the other one of the two inverted L antennas 12 can send received power to the power detector 20 connected to the other one of the two inverted L antennas 12 via the connection switch 82, like the probe 16 of the first embodiment.

The connection switch 82 can switch the radio signal to be sent to the power detector 20, to one of radio signals extracted from the two inverted L antennas 12.

Here, in a case where only one of the two inverted L antennas 12 is performing transmission, the connection switch 82 is switched to the other one of the inverted L antennas 12, so that impedance matching can be automatically performed on the antenna performing the transmission by virtue of the same function as that of the first embodiment. By alternately repeating this process, impedance matching can be automatically performed on both antennas. To determine which antenna is performing transmission, a control signal may be obtained from a wireless device, for example. Alternatively, two extracted powers are compared with each other, and the antenna with the larger power is determined to be the transmitting antenna, for example.

According to this embodiment, high-precision impedance matching can be realized without a large increase in the number of components in an array antenna such as a MIMO (Multiple Input Multiple Output).

While certain embodiments have been described, these embodiments have been presented by way of example only, and are not intended to limit the scope of the inventions. Indeed, the antenna devices and the wireless communication apparatuses described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in an impedance matching circuit, several sets of variable impedance elements may be provided, and impedance matching may be repeated on each of the sets, so as to achieve impedance matching. Specifically, capacitors connected in parallel to the same line as that of the third embodiment may form a first variable impedance element, and capacitors connected in series to the line may form a second variable impedance element. The controller performs control so that impedance matching is performed on the first variable impedance element and the second variable impedance element independently of each other. By this technique, even more precise impedance matching can be realized.

In the embodiments, an up/down counter is used, and a control signal based on the number of counts is sent to the impedance matching circuit so as to maximize the detected power. However, the capacity of the impedance matching circuit may be varied as needed, and the correspondence between detected powers and control signals may be stored. The value of the control signal with which the largest power is detected may be used in performing impedance matching.

What is claimed is:

1. An antenna device comprising:
an antenna having a feeding point and an end portion apart from the feeding point, the end portion being an open end;
a variable impedance matching circuit connected to the antenna at the feeding point;
a probe placed in such a position that a distance from the end portion to a tip of the probe is equal to or shorter than one eighth of a wavelength corresponding to a maximum radio frequency used in the antenna device; and
a controller controlling the variable impedance matching circuit based on an electrical signal measured with the probe, the controller being connected to the probe.

2. The device according to claim 1, wherein a resonant frequency of the probe is higher than the maximum radio frequency.

3. The device according to claim 1, wherein the probe is a differential probe.

4. The device according to claim 1, wherein
the antenna has a shape splitting into branches when seen from the feeding point,
end portions of all the branches are open ends, and
the probe is placed in such a position that each of the distances from the end portions to the tip of the probe is equal to or shorter than one eighth of the wavelength corresponding to the maximum radio frequency used in the antenna device.

5. The device according to claim 1, wherein
the controller comprises:
a power detector connected to the probe;
an AD converter converts an analog output of the power detector into binary data;
a buffer stores binary data at a certain sampling time;
a comparator compares a value of the binary data from the AD converter with a value of the binary data stored in the buffer; and
an up/down counter having the number of counts increasing or decreasing with comparison logic performed by the comparator, a binary output of the up/down counter being connected to a plurality of variable impedance elements in the variable impedance matching circuit.

6. The device according to claim 1, wherein
the controller comprises:
a power detector connected to the probe;
an AD converter converts an analog output of the power detector into binary data;
a first buffer stores the binary data at a first time;
a second buffer stores binary data at a second time, the second time being one sampling time before the first time;
a comparator compares a value of the binary data stored in the first buffer with a value of the binary data stored in the second buffer;
an up/down counter having the number of counts increasing or decreasing with comparison logic performed by the comparator; and
a DA converter outputs a bias voltage to the variable impedance matching circuit in accordance with a binary value of the number of counts in the up/down counter.

7. The device according to claim 1, further comprising
a power amplifier connected to the opposite side of the variable impedance matching circuit from the antenna, wherein
a gain signal of the power amplifier is input to the controller, and
based on the gain signal, the controller controls the variable impedance matching circuit.

8. The device according to claim 1, wherein the antenna is an inverted L antenna.

9. The device according to claim 1, wherein the variable impedance matching circuit comprises a variable inductor and a variable capacitor.

10. The device according to claim 1, wherein the variable impedance matching circuit comprises a variable-capacitance diode and an inductor.

11. A wireless communication apparatus comprising
an antenna device and a wireless device,
the antenna device comprising:
an antenna having a feeding point and an end portion apart from the feeding point, the end portion being an open end;
a variable impedance matching circuit connected to the antenna at the feeding point;
a probe placed in such a position that a distance from the end portion to a tip of the probe is equal to or shorter than one eighth of a wavelength corresponding to a maximum radio frequency used in the antenna device; and
a controller controlling the variable impedance matching circuit based on an electrical signal measured with the probe, the controller being connected to the probe,
the wireless device being connected to the opposite side of the variable impedance matching circuit from the antenna.

12. The apparatus according to claim 11, wherein a resonant frequency of the probe is higher than the maximum radio frequency.

13. The apparatus according to claim 11, wherein the probe is a differential probe.

14. The apparatus according to claim 11, wherein
the antenna has a shape splitting into branches when seen from the feeding point,
end portions of all the branches are open ends, and
the probe is placed in such a position that each of the distances from the end portions to the tip of the probe is equal to or shorter than one eighth of the wavelength corresponding to the maximum radio frequency used in the antenna device.

15. The apparatus according to claim 11, wherein
the controller comprises:
a power detector connected to the probe;
an AD converter converts an analog output of the power detector into binary data;
a buffer stores binary data at a certain sampling time;
a comparator compares a value of the binary data from the AD converter with a value of the binary data stored in the buffer; and
an up/down counter having the number of counts increasing or decreasing with comparison logic performed by the comparator, a binary output of the up/down counter being connected to a plurality of variable impedance elements in the variable impedance matching circuit.

16. The apparatus according to claim 11, wherein
the controller comprises:

a power detector connected to the probe;

an AD converter converts an analog output of the power detector into binary data;

a first buffer stores the binary data at a first time;

a second buffer stores binary data at a second time, the second time being one sampling time before the first time;

a comparator compares a value of the binary data stored in the first buffer with a value of the binary data stored in the second buffer;

an up/down counter having the number of counts increasing or decreasing with comparison logic performed by the comparator; and a DA converter outputs a bias voltage to the variable impedance matching circuit in accordance with a binary value of the number of counts in the up/down counter.

17. The apparatus according to claim 11, wherein
the antenna device further comprises a power amplifier connected to the opposite side of the variable impedance matching circuit from the antenna, a gain signal of the power amplifier is input to the controller, and based on the gain signal, the controller controls the variable impedance matching circuit.

18. The apparatus according to claim 11, wherein the antenna is an inverted L antenna.

19. The apparatus according to claim 11, wherein the variable impedance matching circuit comprises a variable inductor and a variable capacitor.

20. The apparatus according to claim 11, wherein the variable impedance matching circuit comprises a variable-capacitance diode and an inductor.

* * * * *